(12) United States Patent
Deng et al.

(10) Patent No.: US 8,972,229 B2
(45) Date of Patent: Mar. 3, 2015

(54) FAST 3D MASK MODEL BASED ON IMPLICIT COUNTORS

(71) Applicant: Synopsys, Inc., Mountain View, CA (US)

(72) Inventors: Zhijie Deng, San Diego, CA (US); Qiliang Yan, Portland, OR (US); James P. Shiely, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 147 days.

(21) Appl. No.: 13/830,471

(22) Filed: Mar. 14, 2013

(65) Prior Publication Data

US 2014/0032199 A1    Jan. 30, 2014

Related U.S. Application Data

(60) Provisional application No. 61/676,832, filed on Jul. 27, 2012.

(51) Int. Cl.
*G06F 17/50* (2006.01)
*G03F 1/00* (2012.01)

(52) U.S. Cl.
CPC ............. *G06F 17/5009* (2013.01); *G03F 1/00* (2013.01)
USPC ................ 703/6; 703/13; 703/18; 429/285.1; 429/325; 257/72

(58) Field of Classification Search
USPC ........... 703/6, 13, 18; 430/285.1, 325; 257/72
See application file for complete search history.

(56) References Cited

U.S. PATENT DOCUMENTS

| | | | | |
|---|---|---|---|---|
| 5,300,735 A | * | 4/1994 | Yokono et al. | 174/264 |
| 8,034,547 B2 | * | 10/2011 | Tsubaki et al. | 430/326 |
| 8,241,840 B2 | * | 8/2012 | Tsubaki et al. | 430/325 |
| 8,291,353 B2 | | 10/2012 | Deng et al. | |
| 2005/0106837 A1 | * | 5/2005 | Nakai et al. | 438/427 |
| 2007/0262318 A1 | * | 11/2007 | Shoji et al. | 257/72 |
| 2009/0011366 A1 | * | 1/2009 | Tsubaki et al. | 430/285.1 |
| 2010/0330507 A1 | * | 12/2010 | Tsubaki et al. | 430/325 |

* cited by examiner

*Primary Examiner* — Thai Phan
(74) *Attorney, Agent, or Firm* — Fenwick & West LLP

(57) ABSTRACT

Computer-readable medium and methods for photolithographic simulation of scattering. A design layout comprising a layout polygon is received. A skeleton representation of a mask shape that is created responsive to e-beam writing of the layout polygon is generated. The skeleton representation is defined by a plurality of skeleton points. Individual scattering patterns for the skeleton points are selected from a lookup table of pre-determined scattering patterns. Each of the individual scattering patterns representing an amount of optical scattering for a corresponding one of the skeleton points. A simulated wafer image is produced responsive to the individual scattering patterns.

19 Claims, 6 Drawing Sheets

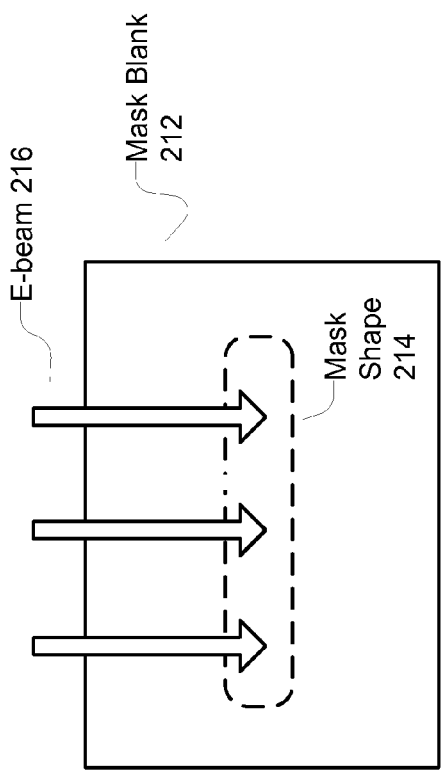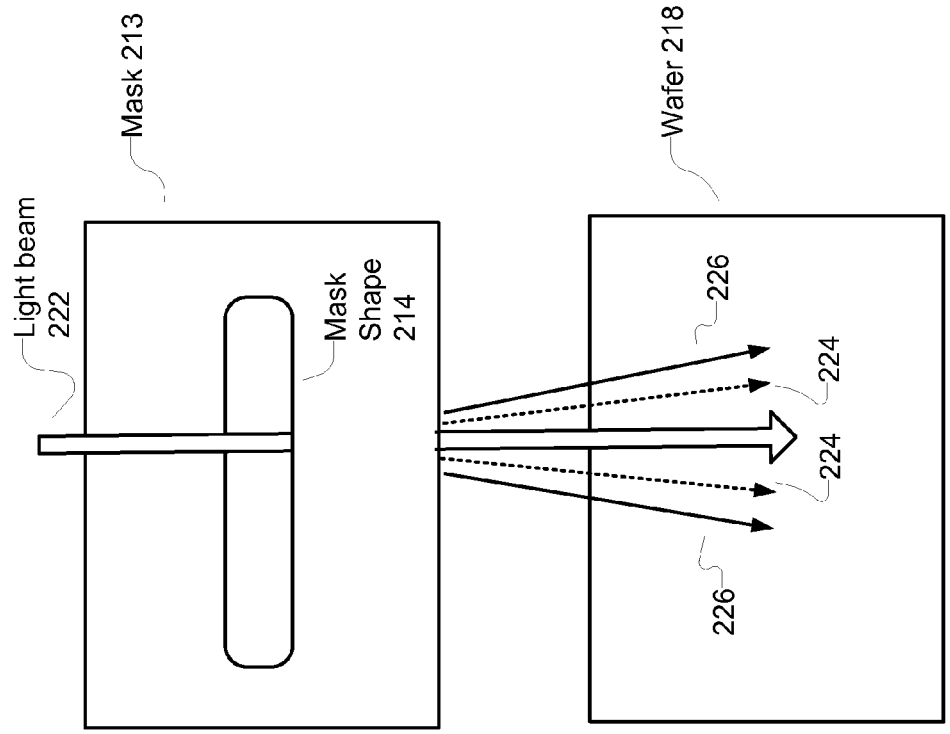

FAST 3D MASK MODEL BASED ON IMPLICIT COUNTORS

CROSS-REFERENCE TO RELATED APPLICATION(S)

This application claims priority under 35 U.S.C. §119(e) to U.S. Provisional Patent Application Ser. No. 61/676,832, "Fast 3D Mask Model Based on Implicit Contours for Full-Chip OPC," filed Jul. 27, 2012. The subject matter of all of the foregoing is incorporated herein by reference in their entirety.

BACKGROUND

1. Field of the Disclosure

This disclosure relates to photolithography simulation, and more specifically to simulation of optical scattering during mask photolithography simulation.

2. Description of the Related Art

In transferring a design layout (e.g. a circuit design layout) to a lithography mask, the mask writer will introduce parasitic distortions such as corner rounding, even with mask error correction. To properly simulate the distortions of the mask writer during optical proximity correction (OPC) and verification, the input to the simulation process is often in the form of mask contours (curved shapes) instead of sharp layout polygons. Additionally, optical scattering caused by sub-wavelength geometries in the mask will cause further distortions in the final design. The effect of this optical scattering may be referred to as the 3D mask effect. During OPC and verification simulation, the 3D mask effect should also be compensated for based on the more accurate mask contours. For full-chip applications like OPC and verification, it is important to simulate these two effects simultaneously with acceptable speed.

SUMMARY

Embodiments of the present disclosure include computer-readable medium and methods for photolithographic simulation. In one embodiment, a design layout comprising a layout polygon is received. A skeleton representation of a mask shape that is created responsive to e-beam writing of the layout polygon is generated. The skeleton representation is defined by a plurality of skeleton points. Individual scattering patterns for the skeleton points are selected from a lookup table of pre-determined scattering patterns. Each of the individual scattering patterns representing an amount of scattering of a light beam for a corresponding one of the skeleton points. A simulated wafer image is produced based on the individual scattering patterns.

In one embodiment, e-beam writing of a mask is first simulated by receiving a design layout comprising a layout polygon and generating an e-beam exposure field. The e-beam exposure field has an array of e-beam exposure values that indicate an e-beam exposure at locations on the mask responsive to e-beam writing of the layout polygon. Photolithographic exposure of the mask to pattern a wafer is then simulated by generating one or more distance maps, each distance map having an array of distance values representing distances from locations on the mask to a mask contour line along a predefined direction, the mask contour line defining a mask shape and determined by thresholding the e-beam exposure field at a threshold value; generating, from the one or more distance maps, a skeleton representation of the mask shape, the skeleton representation defined by skeleton points comprising (a) skin points located on the mask contour line and (b) bone points located in an interior of the mask contour line; selecting individual scattering patterns for the skeleton points from a lookup table of pre-determined scattering patterns, each of the individual scattering patterns representing an amount of scattering of a light beam for a corresponding one of the skeleton points; and producing a simulated wafer image based on the individual scattering patterns.

Another embodiment includes a non-transitory computer readable medium storing instructions that, when executed by a processor, cause the processor to perform the preceding steps.

BRIEF DESCRIPTION OF THE DRAWINGS

The present disclosure has other advantages and features which will be more readily apparent from the following detailed description of the invention and the appended claims, when taken in conjunction with the accompanying drawings, in which:

FIGS. 2A and 2B illustrate a mask photolithography process that will be simulated by EDA software, according to an embodiment.

The figures depict embodiments of the present disclosure for purposes of illustration only. One skilled in the art will readily recognize from the following discussion that alternative embodiments of the structures and methods illustrated herein may be employed without departing from the principles of the invention described herein.

DETAILED DESCRIPTION

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

EDA Design Flow

Figure 1:
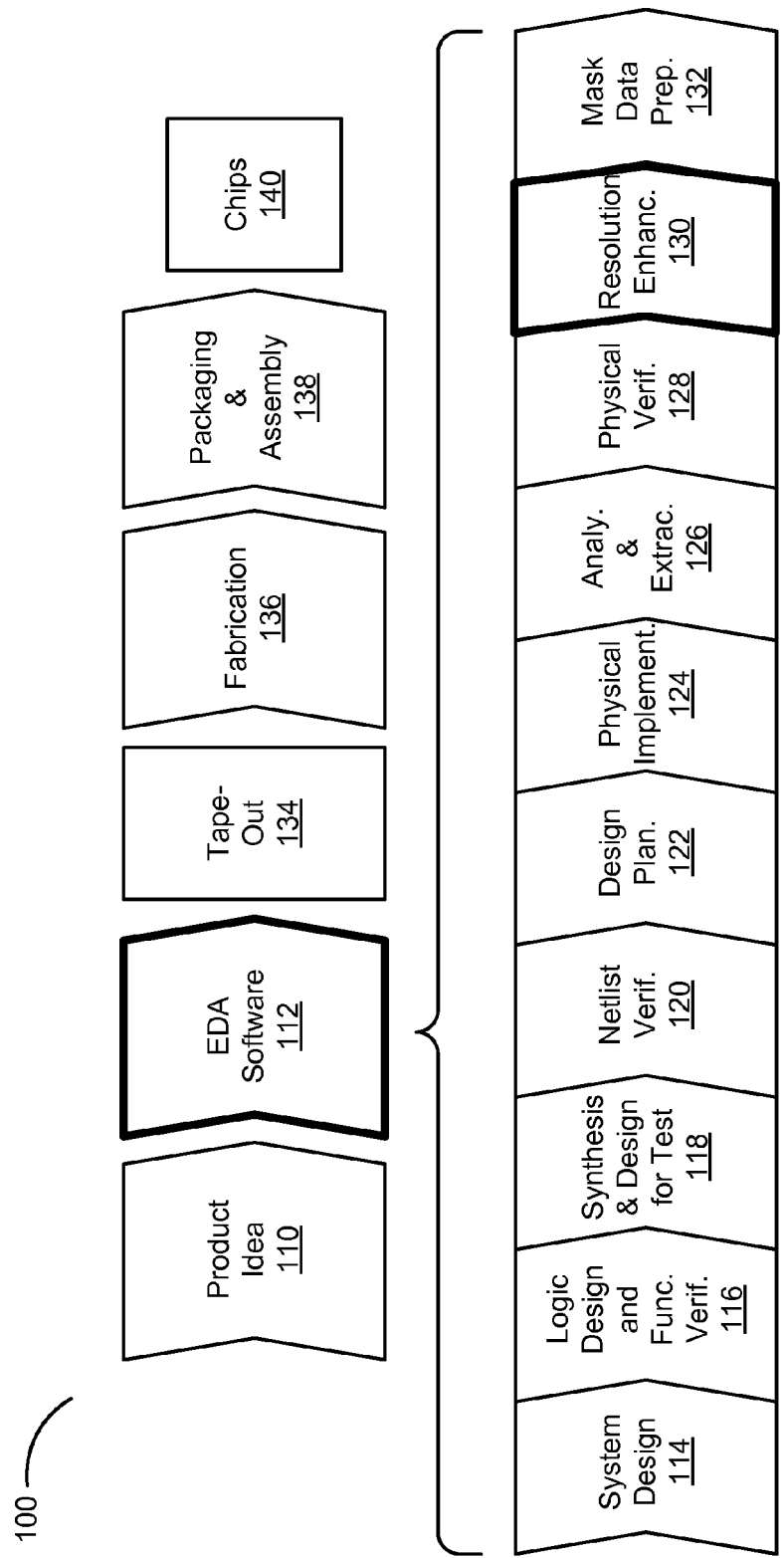
FIG. 1 is a flowchart illustrating the various operations in the design and fabrication of an integrated circuit, according to an embodiment.

FIG. 1 is a flowchart 100 illustrating the various operations in the design and fabrication of an integrated circuit, according to an embodiment. This process starts with the generation of a product idea 110, which is realized during a design process that uses an electronic design automation (EDA) software 112. When the design is finalized, it can be taped-out 134. After tape-out, a semiconductor die is fabricated 136 to form the various features (e.g., gates, metal layers, vias) in the integrated circuit design. Packaging and assembly processes 138 are performed, which result in finished chips 140.

Note that the design process that uses EDA software 112 includes operations 114-132, which are described below. This design flow description is for illustration purposes. In particular, this description is not meant to limit the present disclosure. For example, an actual integrated circuit design may require a designer to perform the design operations in a different sequence than the sequence described herein.

During system design 114, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include Model Architect®, Saber® and System Studio® products.

During logic design and functional verification 116, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include VCS®, Vera®, Magellan®, Formality®, ESP® and Leda® products.

During synthesis and design for test 118, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include Design Compiler®, Physical Compiler®, Test Compiler®, Power Compiler®, FPGA Compiler®, Tetramax®, and Designware® products.

During netlist verification 120, the netlist is checked for compliance with timing constraints and for correspondence with the VHDL/Verilog source code. Example EDA software products from Synopsys, Inc. of Mountain View, Calif. that can be used at this stage include Formality®, Primetime®, and VCS® products.

During design planning 122, an overall floor plan for the chip is constructed and analyzed for timing and top-level routing. Example EDA software products from Synopsys, Inc. of Mountain View, Calif. that can be used at this stage include Astro® and IC Compiler® products.

During physical implementation 124, the placement (positioning of circuit elements) and routing (connection of the same) occurs. Example EDA software products from Synopsys, Inc. of Mountain View, Calif. that can be used at this stage include the Astro® and IC Compiler® products.

During analysis and extraction 126, the circuit function is verified at a transistor level, which permits refinement. Example EDA software products from Synopsys, Inc. of Mountain View, Calif. that can be used at this stage include Astrorail®, Primerail®, Primetime®, and Star RC/XT® products.

During physical verification 128, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 130, the layout undergoes lithographic simulations and geometric manipulations of the layout are performed to improve manufacturability of the design. Lithographic simulation is a two step process that involves mask image simulation and optical image simulation ("optical" is intended to include all wavelength bands used for patterning substrates). In some embodiments, the techniques of the present disclosure may be used during resolution enhancement 130 to simulate the effect of optical scattering in a fast and efficient manner and to produce a simulated wafer image that accounts for the effect of optical scattering. Example EDA software products from Synopsys, Inc. of Mountain View, Calif. that can be used at this stage include Proteus®, Proteus®AF, and PSMGED® products.

During mask-data preparation 132, the "tape-out" data for production of masks to produce finished chips is provided. Example EDA software products from Synopsys, Inc. of Mountain View, Calif. that can be used at this stage include the CATS® family of products.

Mask Photolithography Simulation

FIGS. 2A and 2B illustrate a mask photolithography process that is simulated by EDA software 112, according to an embodiment. FIG. 2A illustrates production of a photomask from a mask blank 212 by exposure to an electron beam 216 ("e-beam"). Referring to FIG. 2A, a mask blank 212 is coated with a layer of e-beam resist. The e-beam resist layer is exposed to an electron beam 216 ("e-beam"). The intensity of the e-beam 216 varies across the surface of the e-beam resist and causes a portion of the mask substrate to be exposed after the exposed e-beam resist is removed. The exposed portion of the mask substrate is shown in the figure as mask shape 214. The mask shape 214 may represent, for example, a circuit feature of the circuit design (i.e. metal trace, polysilicon) that is to be patterned onto a wafer. After further processing of the mask blank, the mask shape 214 is made transparent to light while the surrounding mask area is not. Due to various e-beam effects, the mask shape 214 may not exactly match the desired shape. For example, the desired shape may be a rectangle with square corners but the resulting mask shape 214 may have rounded corners as shown.

Referring to FIG. 2B, the photomask 213 is then used to pattern a wafer 218 through photolithographic exposure. The wafer 218 includes a photoresist layer that can be patterned by exposing the photoresist layer to light. To pattern the photoresist, the mask 212 is exposed to an optical beam 222. Portions of the optical beam 222 pass through the mask shape 214 and illuminate the photoresist on the wafer.

When the light beam 222 passes through the mask shape 214, it may be diffracted or otherwise scattered, especially if the mask shape 214 geometry is comparable in size to the wavelength of the light beam 222. At least two types of scattering may occur as the light beam 222 passes through the mask shape 214. One type of scattering is the scattering 224 caused by the size of the mask shape 214 being comparable to the wavelength of the light beam 222 and can occur regardless of the thickness of the mask 213. This scattering 224 is shown in FIG. 2 with dotted lines. Another type of scattering is the scattering 226 caused by the thickness of the mask 213. An ideal mask is extremely thin to prevent distortions caused by the mask thickness. However, a typical mask 213 produced through e-beam exposure has a non-zero thickness that causes some scattering 226 of the light beam 222 as it passes through the mask shape 214. This scattering 226 is shown in FIG. 2B with solid lines. Other mechanisms may cause other forms of scattering. For convenience, the term "scattering" will be used to refer to diffraction as well as any other effects that cause the light beam 222 to diverge from an exact geometric replica of the mask shape 214.

The scattering 224 and 226 introduces distortions that result in differences between the appearance of the mask shape 214 and the actual exposure of the photoresist on the wafer and the resulting circuit features that are patterned onto the wafer 218. Embodiments of the present disclosure simulate the effects of the scattering 224 and 226 in a fast and efficient manner and produce a simulated wafer image that accounts for the effects of the scattering 220 and 224, including e-beam effects in creating the photomask 212. In one embodiment, the scattering 226 associated with the thickness of the mask 213 can be simulated using a skeleton representation of the mask shape 214 and a pre-computed look up table of scattering patterns.

Figure 3:
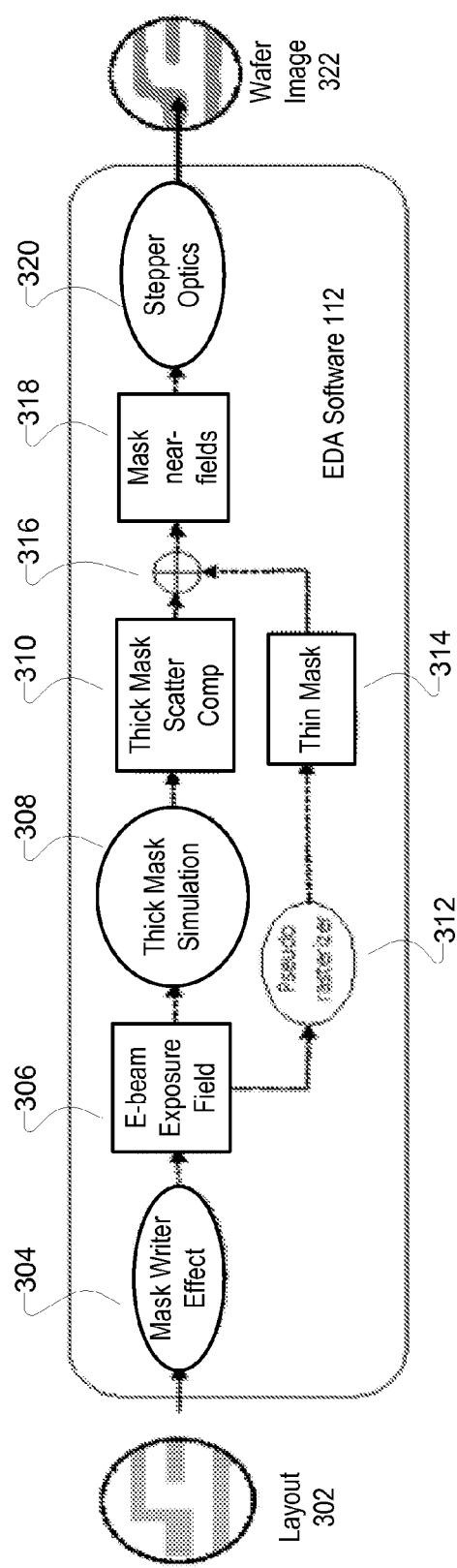
FIG. 3 is a flowchart for mask photolithography simulation in EDA software, according to an embodiment.

FIG. 3 is a flowchart for mask photolithography simulation in EDA software 112, according to an embodiment. As shown, the EDA software 112 includes a mask writer effect model module 304, a scatter simulation module 308, and a stepper optics model module 320. In other embodiments, the EDA software 112 can include other components that are not shown in FIG. 3.

The mask effect writer module 304 simulates the production of mask shapes 214 from the layout 302 of the circuit design. Initially, the mask writer effect module 304 receives a layout 302 for a circuit design that includes one or more layout polygons. Each layout polygon represents a feature of the circuit design, such as a polysilicon trace, metal trace, or other features. The mask effect writer module 304 outputs an e-beam exposure field 306 that represents the intensity of the e-beam 216 across the mask e-beam resist. The e-beam exposure field 306 may include an array of e-beam exposure values where each of the e-beam exposure values represents the e-beam 216 exposure at a different location on the mask e-beam resist. The exposure values implicitly form a mask contour line that defines the boundaries of a mask shape 214, as will be explained herein.

The pseudo rasterizer 312 receives the e-beam exposure field 306 and converts the e-beam exposure field 306 into a thin mask image 314. The thin mask image 314 represents the exposure of the wafer 218 to the light beam 222 under the assumption that the mask 213 has zero thickness, and accounts for some of the scattering 224 caused by the mask shape 214. In one embodiment, the pseudo rasterizer 312 generates the thin mask image 314 to implicitly represent the contour line from the e-beam exposure field 316, but in a lower resolution than the e-beam exposure field 306. In other embodiments, other techniques may be used to generate the think mask image 314 from the e-beam exposure field 306.

Thick mask simulation module 308 simulates the optical scattering 226 due to thickness of the mask 212 that occurs when the photomask 212 is illuminated by light beam 222. Specifically, the scatter simulation module 308 receives the e-beam exposure field 306, which implicitly represents mask shapes 214 of the mask 212. The scatter simulation module 308 then generates a thick mask scattering compensation image 310 that represents the overall amount of scattering 226 caused by the thickness of the mask 213 when exposing the wafer photoresist to light beam 222.

Thin mask image 314 (which represents the illumination of the wafer photoresist accounting for scattering 224) and thick mask image 310 (which represents the effects of scattering 226 due to thickness of the mask 213) are combined 316 to produce a mask near-field image 318. The resulting mask near-field image 318 thus represents the illumination of the wafer photoresist that accounts for both types of scattering 224 and 226. The stepper optics model module 320 accounts for any effects due to the stepper optics, for example aberrations introduced by the stepper optics. The mask near-field image 318 is processed by the stepper optics module 320 to produce a simulated wafer image 322. The simulated wafer image 322 represents the appearance of an integrated circuit that is fabricated using the mask 212. The simulated wafer image can include one or more circuit features that are to be fabricated onto the wafer 218, and the appearance of those features accounts for any distortions caused by scattering during the mask photolithography process (including e-beam writing of the mask).

Figure 4:
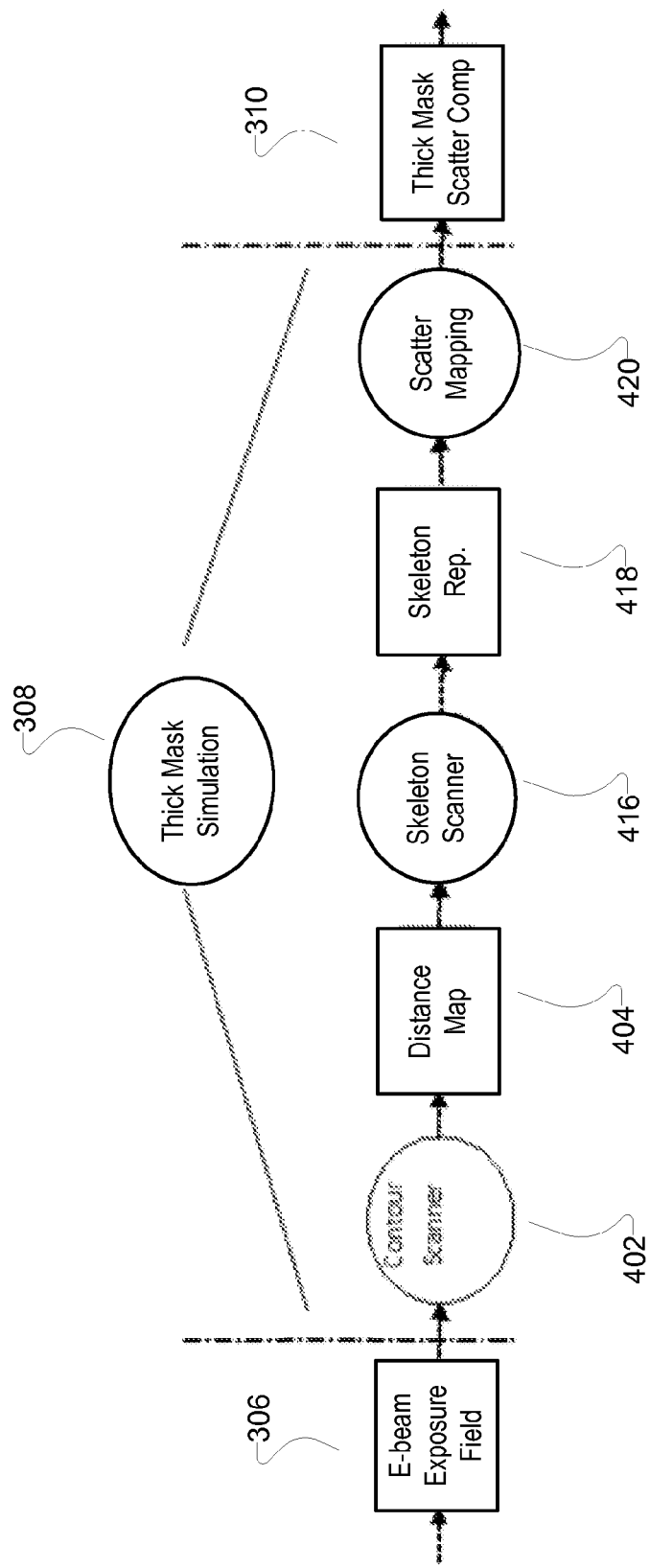
FIG. 4 is flowchart for the scatter simulation module from FIG. 2, according to an embodiment.

FIG. 4 is detailed view of the thick mask simulation module 308 from FIG. 3, according to an embodiment. The thick mask simulation simulation module 308 includes a contour scanner module 402, a skeleton scanner module 416, and a scatter mapping module 410. In other embodiments, the scatter simulation module 308 can include other modules that are not shown in FIG. 4.

The contour scanner module 402 receives the e-beam exposure field 306 and generates one or more distance maps 404 from the e-beam exposure field 306. The skeleton scanner module 416 receives the distance maps and uses the distance maps to generate a skeleton representation 418 of the mask shape. The scatter mapping module 420 receives the skeleton representation 418 and produces the thick mask scattering compensation image 310, which represents an overall amount of optical scattering 220 associated with the photolithographic exposure of the mask 212 and wafer 218.

Figure 5:
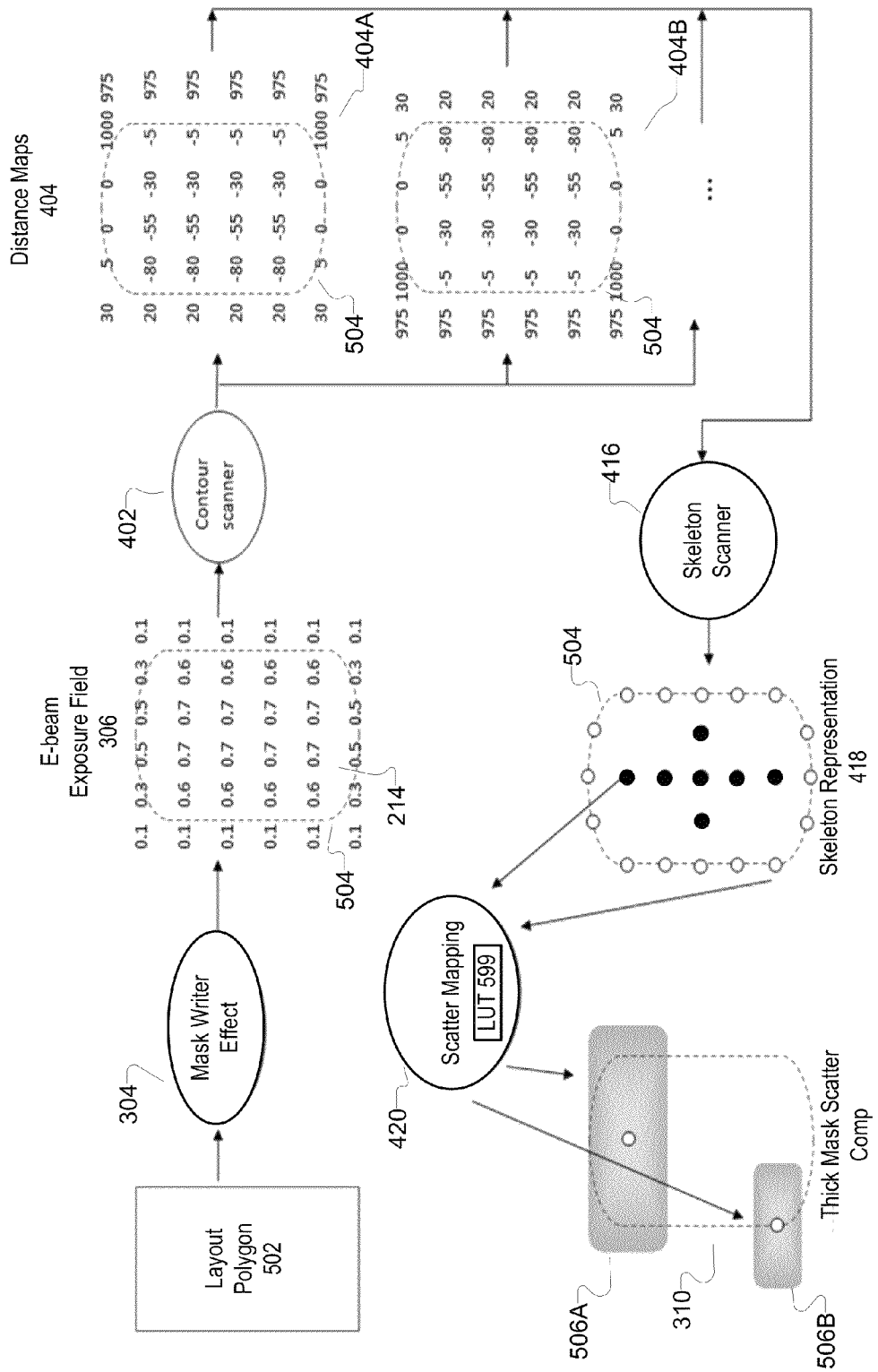
FIG. 5 is an example of inputs to and outputs from the modules of FIG. 3 and FIG. 4, according to an embodiment.

FIG. 5 is an example of inputs to and outputs from the modules of FIG. 3 and FIG. 4, according to an embodiment. Mask effect writer module 304 receives a circuit design layout 302 that includes one or more layout polygons 502. The mask effect writer module 304 simulates fabrication of the mask 212 that is produced from the layout polygon 502 and outputs an e-beam exposure field 306. The e-beam exposure field 306 includes a 6×6 array of e-beam exposure values. Each e-beam exposure value represents an amount of e-beam exposure at a particular location on the mask e-beam resist. The e-beam exposure values are on a scale of 0.0 to 1.0. A value of 0.0 indicates a low amount of e-beam exposure and a value of 1.0 indicates a high amount of e-beam exposure. In other embodiment, the e-beam exposure field 306 can have a different number of exposure values, and the exposure values may be on a different scale.

The e-beam exposure values implicitly define a mask contour line 504 at locations in the mask contour field 504 where the e-beam exposure is equal to the threshold exposure value of 0.5. Points inside the contour line represent areas where the e-beam 216 intensity is high enough to expose the e-beam resist so that it can later be stripped away, thereby uncovering the mask blank. Points outside the contour line represent areas where the e-beam 216 intensity is not high enough for the e-beam resist to be later stripped away. The mask contour line 504 also represents the outer boundary of the mask shape 214. In other embodiments, the threshold exposure value may be set to values other than 0.5.

Contour scanner module 402 scans the e-beam exposure field 306 to produce one or more distance maps 404. A distance map 404 may include array of distance values, such as a 6×6 array of distance values shown in FIG. 5. Each distance value indicates the distance from a location in the distance map 404 to the mask contour line 504 along a single pre-defined direction. In one embodiment, a distance map 404 can be generated by measuring distances between individual locations in the distance map 404 and the closest mask contour line (e.g., mask contour line 504 or other mask contour lines not shown in FIG. 5) along the pre-defined direction.

The contour scanner module 402 may generate multiple distance maps 404, each of which represents a distance to the mask contour line 504 along a different pre-defined direction. For example, distance map 404A is generated by measuring a distance to the contour line 504 by looking to the right (the distance between points in exposure field 306 is 25). The plus and minus values indicate whether the specific point is in the exposed area inside the contour line 504 or underexposed area outside of the contour line. Distance map 404B is generated by measuring a distance to the contour line 504 by looking to the left. In one embodiment, the contour scanner module 402 generates four distance maps 404 for four different directions: one that measure distance to the left, another that measures distance to the right, another that measures distance upwards, and another that measures distance downwards.

Skeleton scanner module 416 converts the distance maps 404 into a skeleton representation 418 of the mask shape 214. The skeleton representation 418 captures the geometry of the mask shape 214 and mask contour line 504 with a limited set of discrete skeleton points. The discrete skeleton points can be divided into "skin" points and "bone" points. In FIG. 5, there are sixteen skin points shown with no shading, and seven bone points forming a cross shown with dark shading. In other embodiments, there may be fewer or greater number of skeleton points. Additionally, the total number of skeleton points depends on the size of the mask shape 214. Larger mask shapes 214 result in a larger number of skeleton points and smaller mask shapes 214 result in a smaller number of skeleton points.

Skin points are located on the contour line 504 and form the exo-skeleton of the skeleton representation 418. Each skin point can include information describing (1) location of the skin point and (2) orientation of the contour line 504 as it passes through the skin point. Bone points are located inside of the contour line 504 and form the interior skeleton of the skeleton representation 418. Bone points may be equidistant between two portions of the contour line 504, such as two portions of the contour line that are on opposite sides of a bone point. Each bone point can include information describing (1) location of the bone point (2) distance to the contour line 504 and (3) directions in which the distance to the contour line 504 is measured.

Scatter mapping module 420 converts the skeleton representation 418 of the mask shape 214 into the thick mask scattering compensation image 310. The scatter mapping module 420 uses each skeleton point of the skeleton representation 418 as a key for retrieving a scattering pattern 506 from a library of pre-determined scattering patterns. In one embodiment, the scattering patterns 506 are texture maps. Each of the scattering patterns 506 indicates an amount of optical scattering 226 due to thickness of the mask 213 for a particular exposure scenario and can be previously computed with a rigorous physics solver that determines an amount of scattering 226 for possible optical beam 222 exposure scenarios. Computing the effects of scattering 226 can utilize a significant amount of computing power due to the complexity of the computations. However, because the scattering patterns 506 are pre-computed, the computations do not need to be repeated during simulation, thereby significantly reducing the amount of time needed to simulate the effects of the scattering 226. For faster access, the scattering patterns 506 may also be stored in a look up table 599 that maps configurations of skeleton points to the scattering patterns 506.

The individual scattering patterns 506 are applied at the locations of their corresponding skeleton points. For example, scattering pattern 506A is applied to a different skeleton point than scattering pattern 506B. Only two scattering patterns are shown in FIG. 310 for ease of illustration. In practice, the scatter mapping module 420 may retrieve many different scattering patterns, one for each of the skeleton points of skeleton representation 418. The scattering patterns 506 are then combined together to form the scatter compensation image 310 that represents an overall amount of scattering 220 caused by the thickness of the mask 212 during photolithographic exposure of the wafer 218.

Figure 6:
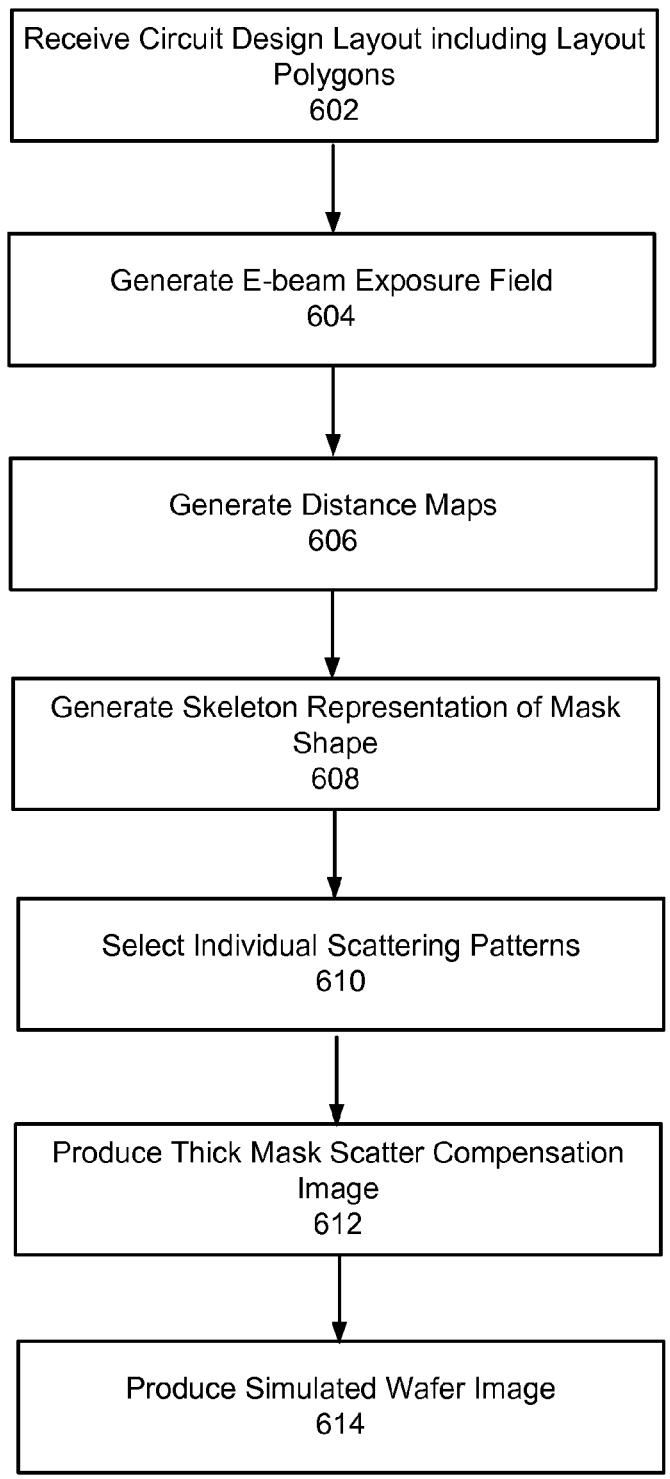
FIG. 6 is a flowchart of a method for mask photolithography simulation, according to an embodiment.

FIG. 6 is a flowchart of a method for mask simulation, according to an embodiment. In step 602, a circuit design layout 302 that includes a layout polygon 502 is received. In step 604 an e-beam exposure field 306 is generated. The e-beam exposure field 306 has an array of e-beam exposure values that represent an e-beam exposure at locations on the mask 212 responsive to e-beam writing of the layout polygon 502. A mask contour line 504 defining a mask shape 214 is implicitly represented by the e-beam exposure values, and the mask contour line 504 can be determined by thresholding the e-beam exposure field 306 at a threshold value.

In step 606, one or more distance maps 404 are generated from the e-beam exposure field 306. Each distance map 404 has an array of distance values representing distances from locations on the mask to the mask contour line 504 along a predefined direction. In step 608, a skeleton representation 418 of the mask shape 214 is generated from the distance maps 404. The skeleton representation 418 is defined by skeleton points, such as (a) skin points located along the mask contour line 504 and (b) bone points located in an interior of the mask contour line 504.

In step 610, individual optical scattering patterns 506 are selected for the skeleton points, for example, from a lookup table of pre-determined scattering patterns. Each of the individual scattering patterns 506 represents an amount of optical scattering for a corresponding one of the skeleton points. In step 612, the individual scattering patterns 506 are combined to produce a thick mask scattering compensation image 310 that represents an overall amount of scattering 226 caused by the thickness of the mask 213 for portions of the optical beam 222 passing through the mask shape 504. In step 614, a simulated wafer image 322 is produced from the thick mask scattering compensation image 310, such as through the process shown in FIG. 3.

Although the detailed description contains many specifics, these should not be construed as limiting the scope of the embodiments but merely as illustrating different examples and aspects of the embodiments. It should be appreciated that the scope of the disclosure includes other embodiments not discussed in detail above. Various other modifications, changes and variations which will be apparent to those skilled in the art may be made in the arrangement, operation and details of the method and apparatus of the present embodiments disclosed herein without departing from the spirit and scope of the invention as defined in the appended claims. Therefore, the scope of the invention should be determined by the appended claims and their legal equivalents.

In the claims, reference to an element in the singular is not intended to mean "one and only one" unless explicitly stated, but rather is meant to mean "one or more." In addition, it is not necessary for a device or method to address every problem that is solvable by different embodiments of the present disclosure in order to be encompassed by the claims.

The disclosed embodiments may be implemented in computer hardware, firmware, software, and/or combinations thereof. Embodiments can be implemented in a computer program product tangibly embodied in a non-transitory computer-readable storage medium for execution by a programmable processor; and method steps of the embodiments can be performed by a programmable processor executing a program of instructions to perform functions of the invention by operating on input data and generating output. The embodiments can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and other forms of hardware.

The term "module" is not meant to be limited to a specific physical form. Depending on the specific application, modules can be implemented as hardware, firmware, software, and/or combinations of these. Furthermore, different modules can share common components or even be implemented by the same components. There may or may not be a clear boundary between different modules.

Depending on the form of the modules, the "coupling" between modules may also take different forms. Dedicated circuitry can be coupled to each other by hardwiring or by accessing a common register or memory location, for example. Software "coupling" can occur by any number of ways to pass information between software components (or between software and hardware, if that is the case). The term "coupling" is meant to include all of these and is not meant to be limited to a hardwired permanent connection between two components. In addition, there may be intervening elements. For example, when two elements are described as being coupled to each other, this does not imply that the elements are directly coupled to each other nor does it preclude the use of other elements between the two.

What is claimed is:

1. A non-transitory computer readable medium storing instructions for photolithographic simulation that, when executed by a processor, cause the processor to perform a method comprising:
    simulating an e-beam writing of a mask by:
        receiving a design layout comprising a layout polygon;
        generating an e-beam exposure field, the e-beam exposure field having an array of e-beam exposure values that indicate an e-beam exposure at locations on the mask responsive to e-beam writing of the layout polygon; and
    simulating a photolithographic exposure of the mask to pattern a wafer by:
        generating one or more distance maps, each distance map having an array of distance values representing distances from locations on the mask to a mask contour line along a predefined direction, the mask contour line defining a mask shape and determined by thresholding the e-beam exposure field at a threshold value;
        generating, from the one or more distance maps, a skeleton representation of the mask shape, the skeleton representation defined by skeleton points comprising (a) skin points located on the mask contour line and (b) bone points located in an interior of the mask contour line; and
        selecting individual scattering patterns for the skeleton points from a lookup table of pre-determined scattering patterns, each of the individual scattering patterns representing an amount of scattering of a light beam for a corresponding one of the skeleton points; and
        producing a simulated wafer image based on the individual scattering patterns.

2. The computer readable medium of claim 1, wherein each of the bone points is equidistant to portions of the mask contour line on opposite sides of the bone point.

3. The computer readable medium of claim 1, wherein the method further comprises:
    combining the individual scattering patterns to produce a scattering compensation image,
    wherein the simulated wafer image is produced based on the scattering compensation image.

4. The computer readable medium of claim 3, wherein the method further comprises:
    generating an e-beam exposure field, the e-beam exposure field having an array of e-beam exposure values that define an e-beam exposure at locations on the mask responsive to e-beam writing of the layout polygon, the mask contour line defining the mask shape and determined by thresholding the e-beam exposure field at a threshold value, and
    wherein the skeleton representation of the mask shape is generated based on the e-beam exposure field.

5. The computer readable medium of claim 4, wherein the method further comprises:
    generating one or more distance maps, each distance map having an array of distance values representing distances from locations on the mask to the mask contour line along a corresponding predefined direction,
    wherein the skeleton representation of the mask shape is generated based on the one or more distance maps.

6. The computer readable medium of claim 3, wherein the skeleton points comprise skin points located along a mask contour line that defines the mask shape, and wherein the individual scattering patterns are selected based on the skin points.

7. The computer readable medium of claim 3, wherein the skeleton points comprise bone points located in an interior of a mask contour line that defines the mask shape, and wherein the individual scattering patterns are selected based on the bone points.

8. The computer readable medium of claim 7, wherein each of the bone points is equidistant to portions of the mask contour line on opposite sides of the bone point.

9. The computer readable medium of claim 3, wherein the method further comprises:
    combining the individual scattering patterns to produce a scattering compensation image,
    wherein the simulated wafer image is produced based on the scattering compensation image.

10. The computer readable medium of claim 3, wherein each of the individual scattering patterns represents an amount of scattering of the light beam due to thickness of the mask.

11. A non-transitory computer readable medium storing instructions for photolithographic simulation that, when executed by a processor, cause the processor to perform a method comprising:
    receiving a design layout comprising a layout polygon;
    generating a skeleton representation of a mask shape that is created responsive to e-beam writing of the layout polygon, the skeleton representation defined by a plurality of skeleton points;
    selecting individual scattering patterns for the skeleton points from a lookup table of pre-determined scattering patterns, each of the individual scattering patterns representing an amount of scattering of a light beam for a corresponding one of the skeleton points; and
    producing a simulated wafer image based on the individual scattering patterns.

12. A computer-implemented method for photolithographic simulation, the method comprising:
  receiving a design layout comprising a layout polygon;
  generating a skeleton representation of a mask shape that is created responsive to e-beam writing of the layout polygon, the skeleton representation defined by a plurality of skeleton points;
  selecting individual scattering patterns for the skeleton points from a lookup table of pre-determined scattering patterns, each of the individual scattering patterns representing an amount of scattering of a light beam for a corresponding one of the skeleton points; and
  producing a simulated wafer image based on the individual scattering patterns.

13. The computer-implemented method of claim 12, wherein the method further comprises:
  generating an e-beam exposure field, the e-beam exposure field having an array of e-beam exposure values that define an e-beam exposure at locations on the mask responsive to e-beam writing of the layout polygon, the mask contour line defining the mask shape and determined by thresholding the e-beam exposure field at a threshold value, and
  wherein the skeleton representation of the mask shape is generated based on the e-beam exposure field.

14. The computer-implemented method of claim 13, further comprising:
  generating one or more distance maps, each distance map having an array of distance values representing distances from locations on the mask to the mask contour line along a corresponding predefined direction,
  wherein the skeleton representation of the mask shape is generated based on the one or more distance maps.

15. The computer-implemented method of claim 12, wherein the skeleton points comprise skin points located along a mask contour line that defines the mask shape, and wherein the individual scattering patterns are selected based on the skin points.

16. The computer-implemented method of claim 12, wherein the skeleton points comprise bone points located in an interior of a mask contour line that defines the mask shape, and wherein the individual scattering patterns are selected based on the bone points.

17. The computer-implemented method of claim 16, wherein each of the bone points is equidistant to portions of the mask contour line on opposite sides of the bone point.

18. The computer-implemented method of claim 12, further comprising:
  combining the individual scattering patterns to produce a scattering compensation image,
  wherein the simulated wafer image is produced based on the scattering compensation image.

19. The computer-implemented method of claim 12, wherein each of the individual scattering patterns represents an amount of scattering of a light beam due to thickness of the mask.

* * * * *